United States Patent
Bachle et al.

[11] 3,931,475
[45] Jan. 6, 1976

[54] ELECTRONIC SWITCHES AND SWITCH NETWORKS

[75] Inventors: Erich Bachle; Helmut Kliem; Bernhard Rall, all of Ulm, Danube, Germany

[73] Assignee: Licentia Patent-Verwaltungs-GmbH, Frankfurt am Main, Germany

[22] Filed: Dec. 17, 1974

[21] Appl. No.: 533,696

[30] Foreign Application Priority Data
Dec. 21, 1973 Germany............................ 2363669

[52] U.S. Cl............................. 179/18 GF; 307/241
[51] Int. Cl.² .......................................... H04Q 3/52
[58] Field of Search.......... 179/18 GF, 18 F, 18 FA; 307/239, 241, 242, 249, 251, 255, 313

*Primary Examiner*—Thomas A. Robinson
*Attorney, Agent, or Firm*—Spencer & Kaye

[57] ABSTRACT

In an electronic switching device for use as the switching component of a switching network in a telephone central office, the device being composed of a switching transistor connected in series in the signal conduction path for switched signals and a controllable impedance connected in a shunt branch, the switching transistor, in its conductive state, having a low series resistance and an associated high shunt resistance, and, in its blocking state, having a high series resistance and an associated low shunt resistance, the shunt branch is composed of a control transistor having a control voltage applied to its base, having its collector connected to the base of the switching transistor, and having its emitter connected to the switching transistor through a resistor to constitute a feedback path for the switching transistor, a voltage-dependent resistor connected to the base of the switching transistor, and suitable sources of operation voltages, the voltages and characteristics of the voltage-dependent resistor being selected to be such that when the switching transistor is conductive, the control transistor operates conductively in its active region and the voltage-dependent resistor presents a high resistance and when the switching transistor is blocking the control transistor is also blocking and the voltage-dependent resistor has a low resistance and supplies to the base of the switching transistor a voltage which maintains the switching transistor blocking.

11 Claims, 5 Drawing Figures

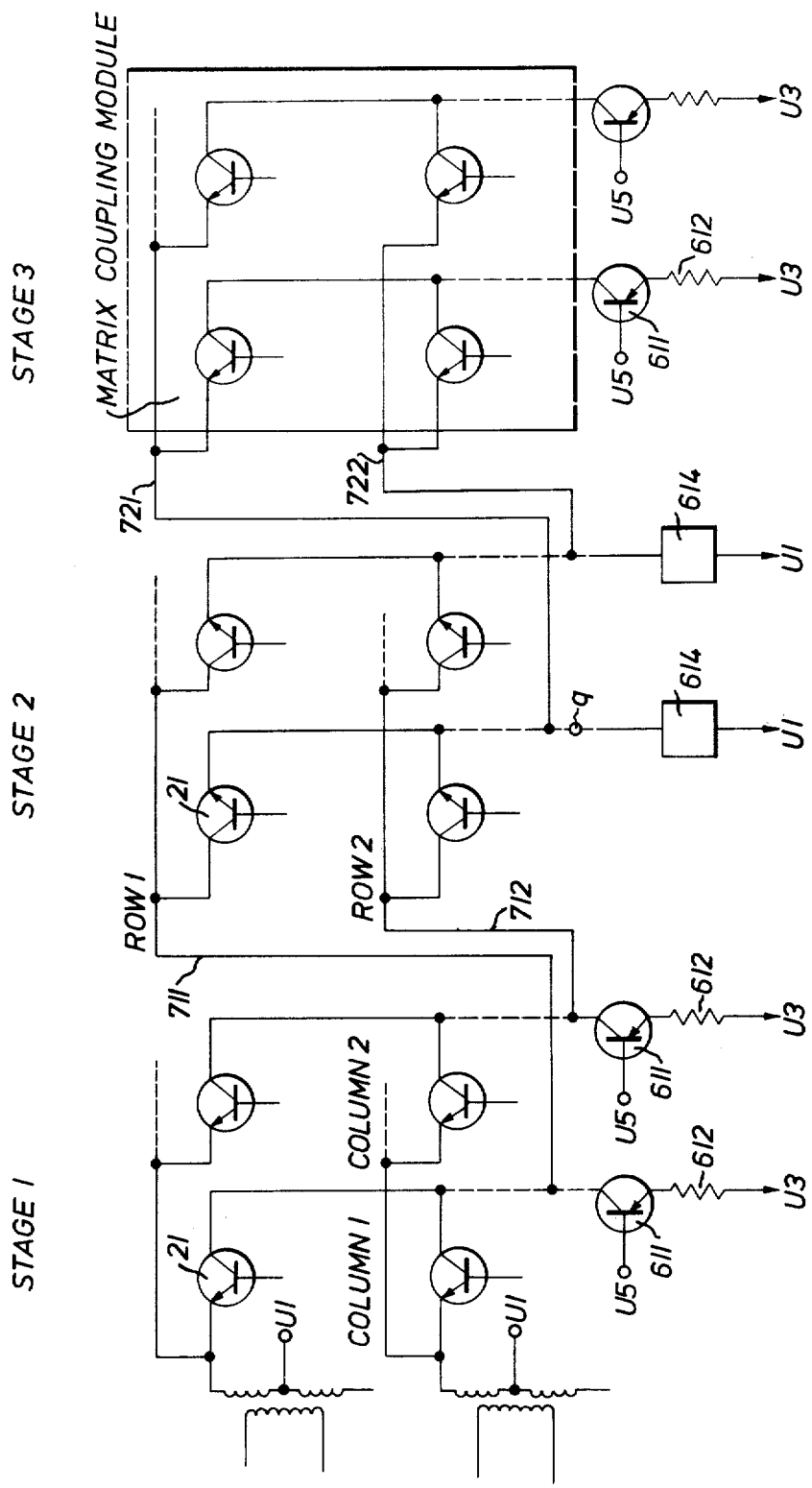

ELECTRONIC SWITCHES AND SWITCH NETWORKS

BACKGROUND OF THE INVENTION

The present invention relates to an electronic switching device, or component, for the switching networks of telephone central offices, the switching device including a switching transistor disposed in the series branch in the signal conduction path and controllable semiconductor devices in a shunt branch which is disposed transversely to the signal conduction path. In the conductive state of the switching transistor, the device has a low series resistance and a high shunt impedance and in the blocking state, the device has a high series resistance and a low shunt impedance.

German Auslegeschrift [Published Patent Application] No. 1,293,214 discloses an electronic switching device with bistable behavior, for the switching of lines in telegraph and particularly telephone central offices of the above-mentioned type, in which the shunt resistance is a voltage-dependent resistor whose impedance can be changed between different values by the control voltage which is applied to the transverse branch and which is dependent on the switching state of the switching device. In this publication it is proposed to connect a variable capacitance diode in parallel with either a resistor, a bipolar transistor or a pn field effect transistor for the controllable transverse branch.

This switching device is limited to using semiconductor devices with bistable behavior in the series branch. In order to keep this switching device in a conductive state after it has been switched on, it is necessary for the direct current flowing therethrough to always be greater than the holding current. Furthermore, interfering pulses in the voice line may cause the switching device to be inadvertently automatically switched off or on.

The magazine *Bulletin Technique* PTT 2 (1973), describes on pages 79–83 a fully integrated space-multiple switching device which is based on the conventional transistor switching device. It includes a bipolar transistor in the series branch and a fixed ohmic resistor in the transverse branch which serves to switch on and off the series branch transistor by means of a control circuit. In order to produce the switching device in a monolithically integrated form, it is modified so that a npn transistor is used in the series branch as the switching element and instead of the fixed resistor a current source in the form of a pnp lateral transistor and an npn transistor are used as the control in the transverse branch. Both transistors have their collector terminals connected to the base terminal of the series branch transistor. The npn transistor in the transverse branch is controlled by a holding flip-flop. If the npn transistor is switched on, i.e. rendered conductive, the series branch transistor is blocked, if the non transistor is switched off, i.e. placed in its blocking state, the series branch transistor is rendered conductive by the pnp lateral transistor.

The above-described circuit, which is the monolithic equivalent of the conventional circuit, has the drawback that the pnp lateral transistor is always switched on, regardless of whether the series branch transistor is blocking or conductive. Thus there continuously exists a relatively high direct current energy loss in the switching device. The result is that the packing density of the semiconductor switching devices in a switching matrix module produced from these semiconductor switching devices is limited, since with the small space occupied by the switching matrix module the energy consumption is a significant parameter because: (1) the operating dependability of the semiconductor switching devices is a function of the crystal temperature of the semiconductors; and (2) the energy loss per housing is limited to about 200 mW and thus determines the degree of integration per housing.

The above-described matrix module thus contains only 2 × 2 symmetrical semiconductor switching devices including the control circuit on a single semiconductor chip.

A further drawback of the described switching device is that the series branch transistor requires a directional DC collector operating current which limits the freedom of choice for the speech path in the switching network to connections from one side to the other and requires complicated junctor circuits with current sinks and capacitively or inductively coupled switching. A relatively high energy consumption in the junctor circuits is the result. Also, the direct collector current ($I_C \approx 10mA$) which flows through one series branch transistor into the junctor circuit is extremely high.

SUMMARY OF THE INVENTION

It is an object of the present invention to overcome the above-mentioned drawbacks of the known monolithic circuits.

It is a more specific object of the invention to provide an electronic switching device which has only a slight energy loss, can be easily integrated, and lends itself to high density fabrication, as well as an advantageous arrangement of the switching devices.

This is accomplished in a switching device of the above-mentioned type by constituting the shunt branch by: a control transistor which is controlled at its base, is connected in feedback via its emitter by means of a resistor, and has its collector connected to the base of the switching transistor; and a voltage-dependent resistor which is also connected to the base of the switching transistor and which is operated by the base potential of the switching transistor to be in its high resistance range when the switching transistor is conductive and in its low resistance range when the control transistor is blocking and the switching transistor is blocked by a defined base potential. The conductivity type of the switching transistor is opposite that of the control transistor. The level of a first operating voltage for the emitter of the switching transistor is higher than the level of the base voltage of the conductively connected control transistor, while the level of a second operating voltage at that terminal of the voltage-dependent resistor which is not connected to the base of the switching transistor is higher than the level of the first operating voltage, and a third operating voltage for the collector of the switching transistor is approximately equal to the operating emitter voltage of the control transistor when it is blocking and is fed to the switching transistor via a resistor having a high resistance such that the switching transistor will operate in the saturation region when it is in its conductive state.

With the switching transistor switched on, the control transistor operating in the active region advantageously produces a high impedance and therefore a low shunt attenuation and when the switching device is blocked, the control transistor will also be blocked in an advantageous manner.

The shunt attenuation when the control transistor is blocking is advantageously increased and the blocking effect of the switching transistor is improved by the connection of the voltage-dependent resistor to the base of the switching transistor, with resistor being controlled by the base potential of the switching transistor so that it presents a high resistance when the switching transistor is conductive and a low resistance when the switching transistor is blocking.

The voltage-dependent resistor may simply be a transistor which is connected in feedback with its emitter connected to a resistor and its base-emitter path biased to always be conducting current.

However, the low energy consumption by the current-conducting base-emitter path can be further reduced if, instead of a bipolar transistor, a field effect transistor is used which remains always conductive but which, as is known, does not require a gate current.

It is further advisable, in order to further save energy, to feed the operating voltage for the collector of the switching transistor through a resistor whose resistance is sufficiently high that in the conducting state of the transistor it operates in the saturation region and carries practically no collector current.

The high resistance collector resistor for the switching transistor is preferably a voltage-dependent resistor which has a high resistance when a collector current flows and a low resistance when no collector current is present.

A resistor with such characteristics can be constituted in a very simple manner also by the collector-emitter path of a transistor whose base-emitter path always conducts current, the emitter current being lower than the current for the switched-on switching transistor. Here, too, a field effect transistor can be used in order to eliminate base-emitter current.

In order to improve the cross-talk attenuation it is advisable to provide two sets of electronic switching contacts in a two-wire switching device so that a symmetrical switching device is produced.

Due to the low energy consumption of the switching device according to the present invention, whose energy dissipation in the blocked state advantageously lies below 1 mW, it is advisably utilized in a switching matrix module in a monolithically integrated fashion. About 5 × 4 symmetrical switching devices can then be accommodated on a silicon substrate of the size of 4 × 4 mm$^2$ without producing undue heating in the switching matrix module.

If the control circuit for the switching device is accommodated on a substrate separate from the switching device substrate and if this is done in a low-energy monolithic type of structure, e.g. using the MOS technique, it will be possible to realize a particularly high component density for the switching devices.

In further accordance with the present invention, a plurality of such switching devices are connected to form a network composed of a plurality of stages with each stage containing a plurality of switching devices arranged in the form of a matrix having a plurality of rows and columns with a respective switching device being located at each intersection of a row and a column, there being an odd number of stages. The network is further composed of a plurality of input means providing signals to be switched, each input means being connected in common to the emitters of the switching transistors of all of the switching devices in a respective row of the first of the stages; a first plurality of connecting lines each connecting the collectors of the switching transistors of all of the devices in a respective column of each odd stage to the collectors of the switching transistors of all the devices in a respective corresponding row of the next succeeding stage, and a second plurality of connecting lines each connecting the emitters of the switching transistors of all of the devices in a respective column of each even stage to the emitters of the switching transistors of all the devices in a respective corresponding row of the next succeeding stage. The network is further arranged to act as a so-called "column short circuit" for the case where all switching devices in the same column are blocked.

In the odd-numbered stages of switching matrices this is accomplished by a single transistor for each column which in this case operates in the saturation region when all switching transistors of that column are blocking and otherwise in the active region. This produces, inter alia, favorable cross-talk conditions in the switching network. When at least one switching device in a column is switched on, the column short circuit is given such a high resistance, by the transistor which operates in the active region to supply the collector voltage of the switching transistor, that its contribution to the insertion loss is negligibly small. This column resistor is here switched automatically in an advantageous manner in dependence on the occupation state of the column to which the link line is connected.

The connection of the individual stages in the manner set forth above makes it possible to establish conference connections in a simple manner, which is of particular significance when the switching network is used in extension systems.

BRIEF DESCRIPTION OF THE DRAWINGS

FIG. 5 is a basic circuit diagram of one embodiment of a switching network according to the invention.

DESCRIPTION OF THE PREFERRED EMBODIMENTS

Figure 1:
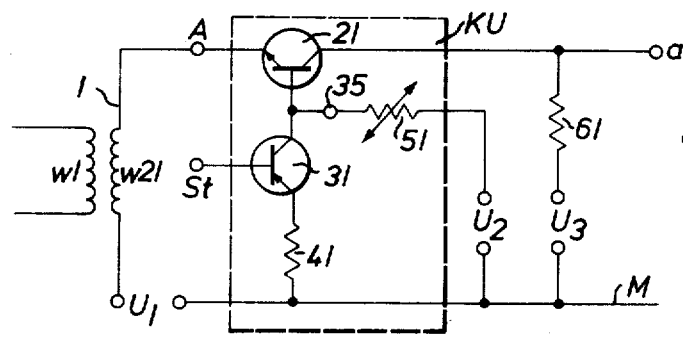
FIG. 1 is a circuit diagram of an asymmetrical switching device constituting one preferred embodiment of the present invention.

FIG. 1 shows an embodiment of a switching device KU according to the invention which includes a bipolar switching transistor 21 of npn conductivity type whose emitter is connected to receive an operating voltage $U_1$ through the secondary winding $w_{21}$ of an exchange transformer 1 of a telephone set connected to the primary winding $w_1$ of the transformer.

The collector of the switching transistor is connected to a source of operating voltage $U_3$ via a high resistance resistor 61.

The shunt resistance is formed, on the one hand, by a pnp control transistor 31 which is controlled by a voltage applied to its base terminal, is connected in feedback via its emitter by means of a resistor 41, and has its collector connected to the base of the switching transistor 21 and, on the other hand, by a voltage-dependent resistor 51 which is also connected to the base of the switching transistor and whose other end is connected to a source of an operating voltage $U_2$.

The operating voltage sources supplying $U_1$, $U_2$ and $U_3$ have a common reference line M to which the emitter resistor 41 of the control transistor 31 is also connected.

The emitter terminal of the switching transistor constitutes input A and the collector terminal of the switching transistor constitutes output a of the asymmetrical switching device KU, which includes the switching transistor 21, the control transistor 31 with resistor 41, and the voltage-dependent resistor 51.

The operating voltages can, according to one example of the present invention, be selected as follows:
$U_1 = -7V; U_2 = -10V; U_3 = 0V.$ If a positive control voltage is present at control terminal St, the control transistor is rendered nonconductive, or blocking, and its collector current is zero. The base voltage of the switching transistor 21, across the voltage-dependent resistor 51, is equal to the operating voltage $U_2 = -10V$ and the emitter voltage of $U_1 = -7V$ applied to the switching transistor causes that transistor to also be non-conductive.

To achieve a small voltage drop across the voltage-dependent resistor 51 this resistor must have a low resistance so that the base of the switching transistor is connected with the reference line M through a small resistance, relative to a.c., and the switching transistor acquires optimum off-attenuation properties which depend practically only on its parasitic switching capacitance between the emitter and collector terminals.

If a control voltage of about −1.6V is applied to the control terminal St, the pnp control transistor 31 becomes conductive. If, for example, the value of the emitter resistor 41 is selected to be 500 Ω, an emitter current of about 2 mA will flow in the control transistor 31 and will divide between the base terminal of the switching transistor 21 and the voltage-dependent resistor 51. At the collector terminal of the control transistor there then appears a voltage of about −6.3V which results from the operating voltage $U_1$, the voltage drop in the secondary winding $w_{21}$ of the transformer 1 and the voltage drop across the beam-emitter path of the switching transistor 21 in the on-state. The voltage across the collector-emitter path of the control transistor 31 is then about −5V so that it operates in the active region and thus has a high impedance. The voltage across the voltage-dependent resistor 51 is about 4V. According to the invention, the voltage-dependent resistor 51 should then also have a high resistance and its shunt attenuation is thus low.

A transistor operates in the saturation region when its voltage across the collector-emitter path if about 0V.

The collector terminal of the switching transistor 21 is connected via resistor 61 to voltage source $U_3$ for direct and alternating current in such a high resistance manner that:

1. the direct collector current $I_C$ of the switching transistor flowing through this resistor is negligibly low ($I_C < 100\mu A$); and
2. the alternating current resistance of this resistor is very high so that no additional shunt attenuation occurs.

If both of the above conditions are satisfied, it will be possible, in a switching network, to establish a subscriber connection directly via a common column wire without the use of a set of connections if all collector terminals of the semiconductor switching devices which lie in the same column are connected to terminals a whenever the semiconductor switching devices of the same column which are required for a connection are switched on.

Figure 2:
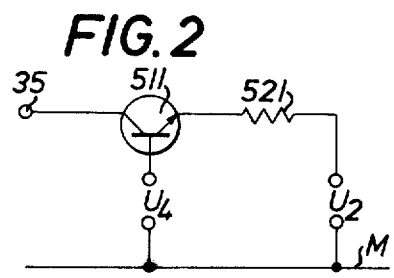
FIG. 2 is a circuit diagram of a voltage-dependent resistor with bipolar transistor, constituting one embodiment of a component of the circuit of FIG. 1.

FIG. 2 shows a circuit for one embodiment of a voltage-dependent resistor which may take the place of resistor 51. In the case where the switching transistor 21 is of the npn type, the voltage-dependent resistor is an npn transistor 511 with an emitter resistor 521 whose free end is connected to the operating voltage source $U_2$. The operating voltage $U_4$ for the base of transistor 511 must be selected to be somewhat higher than the operating voltage $U_2$ so that the emitter-base path of the transistor always remains conductive. For example, $U_4$ may be 1V higher than $U_2$ and resistor 521 may have a resistance of about 1kΩ.

With such operating values the circuit operates with an emitter current of about 0.5 mA and produces an energy loss of less than 0.6 mW.

The collector of transistor 511 must be connected to the base of the switching transistor 21.

Installed into the switching device of FIG. 1, the voltage-dependent resistor of FIG. 2 has a resistance value, when the control transistor 31 is blocking, of about 1.1kΩ, so that the switching transistor 21 receives an off-attenuation which depends practically only on the switching capacitance between its emitter and collector.

When the switching transistor 21 is switched on, there is a drop of approximately 4V across the voltage-dependent resistor. Transistor 511 then operates in the active region and has the desired high impedance, e.g. > 500kΩ.

Figure 3:
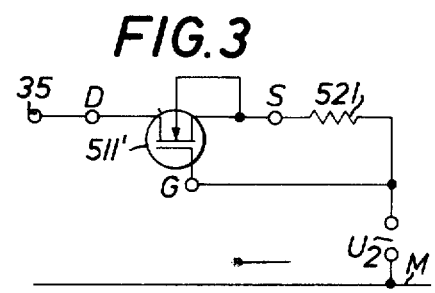
FIG. 3 is a circuit diagram of a voltage-dependent resistor with field effect transistor, constituting a second embodiment of such component of the circuit of FIG. 1.

FIG. 3 corresponds to FIG. 2 with the exception that the bipolar npn transistor 511 is replaced by a field effect transistor 511' having a source S and drain D. For example, an n channel MOSFET of the depletion type or an n channel PNFET can be used. Its gate terminal G may be connected directly to the source of operating voltage $U_2$ so that in addition to the elimination of a base current, a further electrode terminal is also eliminated.

Furthermore, the collector resistor 61 of the switching transistor 21 of FIG. 1 can also be replaced in an advantageous manner by either of the circuit arrangements shown in FIGS. 2 and 3. The collector of transistor 511 would then be connected to the collector of the switching transistor 21. If instead of the npn transistor 511, a transistor of the opposite conductivity type must be used, voltage source $U_2$ is replaced by voltage source $U_3$ and voltage source $U_4$ is replaced by a voltage source $U_5$ which is higher by about 1V, so that the base-emitter path of the transistor of the voltage dependent resistor is always maintained conductive.

Such an arrangement is shown in FIG. 5, to be described below, in a circuit including a transistor 611 with an associated emitter resistor 612.

When the transistor 611 and resistor 612 are used as resistor 61 in the circuit of FIG. 1, the emitter current of transistor 61 is advisably set, by selection of base voltage U5 and emitter resistor 612, to be less than 0.1 mA. The emitter current of transistor 611 is thus substantially less than the emitter current of the conductive switching transistor.

When switching transistor 21 is blocking, transistor 611 operates in the saturation region, thus presenting a low resistance ($\approx 2k\Omega$), and therefore practically short-circuits line a which is connected to the collector of the switching transistor 21. When the switching device is used in a switching matrix in which a plurality of switching transistors have their collectors connected to a column line, transistor 611, only one of which then need be provided for each column, acts as a column short circuit when the switching transistors are blocking.

Figure 4:
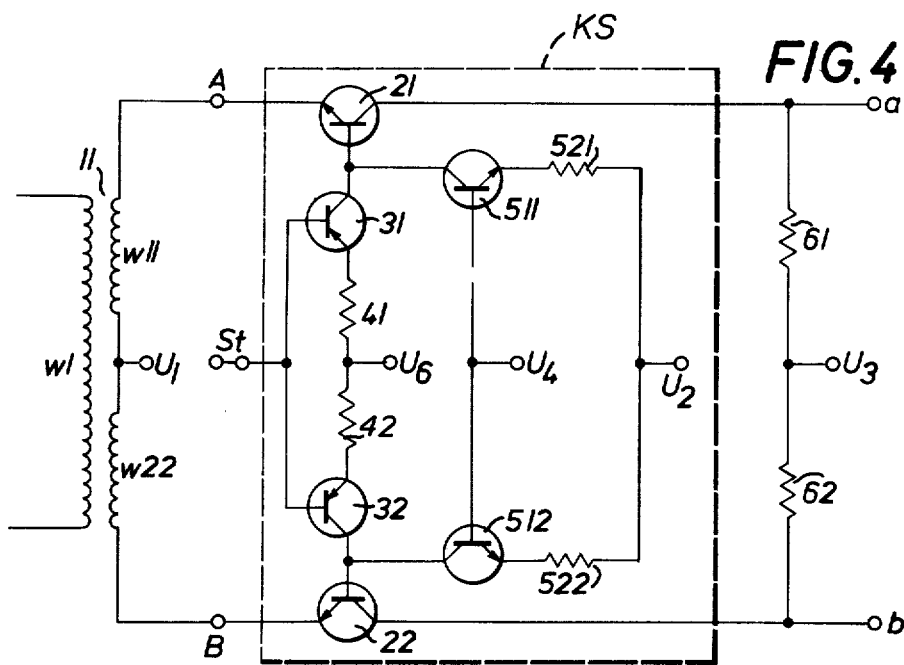
FIG. 4 is a circuit diagram of a symmetrical switching device representing a second embodiment of the invention.

FIG. 4 shows a symmetrical switching device circuit arrangement according to the present invention which is provided in a known manner with a higher cross-talk attenuation, particularly for monolithically integrated embodiments.

The switching device KS of this embodiment includes two switching transistors 21 and 22 each having its emitter-collector path connected serially between the input A or B and output $a$ or $b$ of a respective side of the signal switching path. The base of transistor 21 is connected to a shunt branch composed of control transistor 31, emitter resistor 41, and a voltage-dependent resistance composed of transistor 511 and its associated emitter resistor 521. Similarly, the base of transistor 22 is connected to a shunt branch composed of control transistor 32, emitter resistor 42, and a voltage-dependent resistance composed of transistor 512 and its associated emitter resistor 522.

The input to device KS is provided by a coupling transformer 11 having two secondary windings $w_{11}$ and $w_{22}$ each connected to a respective one of input terminals A and B. Control signal input terminal $St$ is connected to the bases of both control transistors 31 and 32. At the output side of device KS there are provided two further voltage-dependent resistances 61 and 62 each connected to a respective one of output terminals $a$ and $b$.

Operating voltage $U_1$ is applied to the center tap between the secondary windings $w_{11}$ and $w_{22}$ of transformer 11, while operating voltage $U_2$ is applied to the other ends of resistors 521 and 522, operating voltage $U_3$ is applied to the other ends of resistances 61 and 62, operating voltage $U_4$ is applied to the bases of transistors 511 and 512, and operating voltage $U_6$ is applied to the other ends of resistors 41 and 42.

With this arrangement, both switching transistors 21 and 22 will always be in the same switching state, i.e. both conductive or both blocking.

All voltages mentioned above relate to 0V

For monolithically integrated embodiments it is advisable to select the following operating voltages:
$U_1 = -5V, U_2 = -8V, U_3 = 2V$ and $U_4 = -9V$,
in order to adapt the base potential of the control transistor to the output voltages of conventional TTL circuits. For this purpose the emitter operating voltage of the control transistors 31 and 32 must also be raised to $U_6 2 = 2V$. For $U_3$ and $U_6$ the same operating voltage sources can be used.

For a collector current of less than $100\mu A$, a base current of 2 mA, average normal and inverse current amplification factors in common emitter connection of $\approx 70$ and $\approx 2$, respectively, and a total emitter plus collector bulk resistance of about $5\Omega$, the impedance of a conductive, monolithically integrated npn switching transistor 21 or 22 $\leq 10\Omega$.

If the impedance of the collector resistance 61 or 62 is then $> 200k\Omega$, the shunt attenuation additionally produced thereby for the symmetrical switching device is negligibly small ($< 1$ mN for a transformer ratio $w_1/w_{11}$ or $w_{22} = 1$ and a terminating impedance of $600\Omega$).

$1mN = 0.001N \approx 0.0087$ decibel N=neper

The transmission loss is thus determined only by the resistance of the switching resistor and is $< 30$ mN for the symmetrical, monolithically integrated semiconductor switching device. The energy loss occurring in the switched-on switching device amounts to about 20mW.

FIG. 5 shows the connection of switching matrix modules, formed of the symmetrical switching devices according to the invention to produce an intermediate line switching arrangement. It is here assumed, for reasons of simplicity, that each switching matrix module forms a stage in a three-stage switching arrangement. To better show the connections between switching devices, only one switching transistor is shown for each such device.

As already mentioned, bipolar transistors 611, which serve as voltage-dependent resistors are connected, to the column lines of the odd-numbered stages 1, 3, etc. The coupling of the stages is effected according to the invention so that, for example, link lines 711 and 712 connect column 1 and column 2, respectively, in the first stage 1 with row 1 and row 2, respectively, in the second stage 2, the collector terminals of the switching transistors being connected to the columns of the first stage 1 and the rows of the second stage 2. The interconnection in the switching network is effected in this way in an advantageous manner because only a very low level current flows through the collector terminals of the switched-on devices and a calling party and called party can be connected together through the column lines of the first stage or of the third stage.

Due to the low collector current of the switching transistors according to the invention it is then possible to connect a plurality of subscribers together via one column line, e.g., for a conference call, because transistors 611 always remain in the active operating region, i.e. they present a high resistance to alternating current, with but a single conductively connected switching transistor and the operating point of the transistors 611 changes only slightly as a result of the interconnection of the subscribers.

If it is noted that a subscriber connection can be made already in the first stage via a common column line, then this can be effected already in this stage by switching on the corresponding switching devices. The subsequent stages are then no longer required to establish the connection.

The interconnection of a plurality of subscribers into a conference connection is appropriate only in columns of the odd-numbered stages. The emitter terminals of the switching transistors are connected to the columns of the even-numbered stages. These emitter terminals are connected to the emitter terminals of the switching transistors of the lines of the next odd-numbered stage via link lines 721, 722, etc. However, the emitter current, which is high compared to the collector current, flows through the emitter terminals of the switching transistors.

Since the emitter current of a switching transistor amounts to about 2 mA, the even-numbered stages must be provided with a device 614 for each column which presents a low resistance to direct current and a high resistance to alternating current to supply the different emitter currents of a column.

This can be accomplished, for example, in that the emitter voltage $U_1$ of each column is supplied via a choke or a transformer winding of a transformer which is provided, for example, for control purposes.

If no more than two switching transistors are ever switched on in an even-numbered stage, the column current can be made available in a manner similar to that in the columns of the odd-numbered stages by a transistor which is connected in feedback in the emitter by means of a resistor, the conductivity type of the transistor being opposite that of the column transistors 611. In the illustrated embodiment the device 614 may comprise, for example, an npn transistor whose collector is connected to the intermediate line and whose emitter current is set, in the same manner as described in connection with FIG. 2, to twice the value of the emitter current of a switching transistor, i.e. to 4 mA in this example.

This accomplishes in an advantageous manner that even with blocking switching transistors in a column of an even-numbered stage the column is short-circuited by the transistor which then operates in the saturation region.

It will be understood that the above description of the present invention is susceptible to various modifications, changes and adaptations, and the same are intended to be comprehended within the meaning and range of equivalents of the appended claims.

We claim:

1. In an electronic switching device for a switching network in a telephone central office, the switching device having a signal input and output and presenting a series branch constituting a switchable signal conduction path extending between the input and the output, and presenting a shunt branch transverse to the conduction path, the switching device including a switching transistor having its collector-emitter path connected in the series branch and impedance means connected in the shunt branch, the transistor being switchable between a conductive state in which the series branch has a low resistance and the shunt branch has a high resistance, and a blocking state in which the series branch has a high resistance and the shunt branch has a low resistance, the improvement wherein:

said impedance means comprise
- a control transistor of opposite conductivity type to said switching transistor and having its collector connected to the base of said switching transistor,
- a source of a control voltage connected to the base of said control transistor,
- a feedback resistor connected to the emitter of said control transistor, and
- voltage-dependent resistor means having one end connected to the base of said switching transistor and controlled by the base voltage of said switching transistor to present a high resistance when said switching transistor is in its conductive state and to present a low resistance when said switching transistor is in its blocking state;

and said device further comprises:
- first operating voltage supply means connected for supplying to the emitter of said switching transistor a first operating voltage having an absolute value greater than that of a control voltage capable of placing said control transistor in its conductive state;
- second operating voltage supply means connected to the other end of said voltage-dependent resistor means for supplying thereto a second operating voltage having an absolute value greater than that of said first operating voltage and sufficient to place the base of said switching transistor at a potential which causes said switching transistor to remain in its blocking state as long as said voltage-dependent resistor means presents such low resistance;
- third operating voltage supply means providing a third operating voltage having a value approximately equal to the voltage across said feedback resistor when said control transistor is in its blocking state; and
- additional resistor means connected between said third operating voltage supply means and the collector of said switching transistor and presenting a high resistance, at least when said switching transistor is in its conductive state, for causing said switching transistor to then operate in its saturation region.

2. A device as defined in claim 1 wherein said voltage-dependent resistor means includes: a bipolar transistor whose conductivity type is the same as that of said switching transistor and whose collector is connected to the base of said switching transistor; a further resistor connected between the emitter of said bipolar transistor and said second operating voltage supply means to provide a defined voltage to the emitter of said bipolar transistor; fourth operating voltage supply means connected to the base of said bipolar transistor for supplying a fourth operating voltage whose value is selected to maintain the base-emitter path of said bipolar transistor permanently conducting.

3. A device as defined in claim 1 wherein said switching transistor is of the npn type, and said voltage-dependent resistor means comprises an n-channel field effect transistor whose drain is connected to the base of said switching transistor and whose gate is connected to said second operating voltage supply means, and a further resistor connected between the source of said field effect transistor and said second operating voltage supply means for feeding a defined current to said source.

4. A device as defined in claim 3 wherein said field effect transistor is an MOS field effect transistor of the depletion mode type.

5. A device as defined in claim 3 wherein said field-effect transistor is of the pn type.

6. A device as defined in claim 1 wherein said additional resistor means comprises second voltage-dependent resistor means for supplying the collector voltage for said switching transistor.

7. A device as defined in claim 6 wherein said second voltage-dependent resistor means comprise: a further transistor whose conductivity type is opposite that of said switching transistor and whose collector is connected to the collector of said switching transistor; a further resistor connected between the emitter of said further transistor and said third operating voltage supply means for feeding a defined emitter current to said further transistor; and a fifth operating voltage supply means connected to the base of said further transistor for supplying a fifth operating voltage whose value is selected to maintain the base-emitter path of said further transistor permanently conducting; the emitter current to said further transistor having a value less than that of the emitter current of said switching transistor in its conductive state, so that when said switching transistor is in its conductive state said further transistor operates in its active region and when said switching transistor is in its blocking state said further transistor operates in its saturation region.

8. A device as defined in claim 1 constituting a symmetrical two-wire switching device.

9. A device as defined in claim 1 which is monolithically integrated in a switching matrix module composed of a plurality of switching devices on a common silicon substrate.

10. Switching system comprising:
a plurality of electronic switching devices as defined in claim 1 connected to form a coupling network composed of a plurality of stages with each stage containing a plurality of said switching devices arranged in the form of a matrix having a plurality of rows and columns with a respective switching device being located at each intersection of a row and a column, there being an odd number of said stages in said system;
a plurality of input means providing signals to be switched, each input means being connected in common to the emitters of said switching transistors of all of said switching devices in a respective row of the first of said stages;
a first plurality of connecting lines each connecting the collectors of said switching transistors of all of said devices in a respective column of each odd stage to the collectors of said switching transistors of all said devices in a respective corresponding row of the next succeeding stage; and
a second plurality of connecting lines each connecting the emitters of said switching transistors of all of said devices in a respective column of each even stage to the emitters of said switching transistors of all said devices in a respective corresponding row of the next succeeding stage; and
wherein, for each odd stage, said additional resistor means for all of said devices in each column comprises a single further transistor connected for supplying the collector voltages to said switching transistors of said column.

11. A system as defined in claim 10 wherein the direct collector current of each said switching transistor is less than $100\mu A$ in the conductive state.

* * * * *